(12) United States Patent
Wang et al.

(10) Patent No.: US 12,046,286 B1
(45) Date of Patent: Jul. 23, 2024

(54) PROGRAMMABLE LOGIC COMPUTATION IN MEMORY

(71) Applicant: MACRONIX INTERNATIONAL CO., LTD., Hsinchu (TW)

(72) Inventors: Yun-Yuan Wang, Kaohsiung (TW); Wei-Chen Chen, Taoyuan (TW); Dai-Ying Lee, Hukou Township, Hsinchu County (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 183 days.

(21) Appl. No.: 17/847,810

(22) Filed: Jun. 23, 2022

Related U.S. Application Data

(60) Provisional application No. 63/302,548, filed on Jan. 24, 2022.

(51) Int. Cl.
| | | |
|---|---|---|
| *G11C 16/04* | (2006.01) | |
| *G11C 16/10* | (2006.01) | |
| *G11C 16/24* | (2006.01) | |
| *G11C 16/26* | (2006.01) | |
| *G11C 16/34* | (2006.01) | |

(52) U.S. Cl.
CPC ........ *G11C 16/0483* (2013.01); *G11C 16/102* (2013.01); *G11C 16/24* (2013.01); *G11C 16/26* (2013.01); *G11C 16/3404* (2013.01)

(58) Field of Classification Search
CPC ... G11C 16/0483; G11C 16/102; G11C 16/24; G11C 16/26; G11C 16/3404

USPC .................................................. 365/185.17
See application file for complete search history.

(56) References Cited

U.S. PATENT DOCUMENTS

| | | | | |
|---|---|---|---|---|
| 5,008,856 A | * | 4/1991 | Iwahashi | G11C 16/12 365/185.23 |
| 7,633,801 B2 | * | 12/2009 | Hanafi | H01L 29/7881 365/185.27 |
| 8,026,561 B2 | * | 9/2011 | Saito | H01L 29/66984 257/295 |
| 8,872,543 B2 | * | 10/2014 | Lin | H03K 19/1776 326/38 |
| 11,593,707 B2 | | 2/2023 | Romero et al. | |
| 2020/0334523 A1 | | 10/2020 | Kumar | |
| 2020/0371974 A1 | | 11/2020 | Boothby | |

(Continued)

FOREIGN PATENT DOCUMENTS

| | | |
|---|---|---|
| TW | 202007091 A | 2/2020 |
| TW | 202121267 A | 6/2021 |

*Primary Examiner* — Tha-O H Bui
(74) *Attorney, Agent, or Firm* — McClure, Qualey & Rodack, LLP

(57) ABSTRACT

A semiconductor circuit and an operating method for the same are provided. The semiconductor circuit includes strings. The strings include a first string and a second string. The first string includes a first device unit and a second device unit in series. The first string has a weight signal W1. The first device unit has an input signal A. The second device unit has an input signal B. The second string includes a third device unit and a fourth device unit in series. The second string has a weight signal W2. The third device unit has an input signal $\bar{A}$. The fourth device unit has an input signal $\bar{B}$. An output signal of the semiconductor circuit is a sum of output string signals of the strings.

20 Claims, 17 Drawing Sheets

(56) References Cited

U.S. PATENT DOCUMENTS

2021/0224680 A1 7/2021 Mohseni
2021/0374596 A1 12/2021 Neven

* cited by examiner

PROGRAMMABLE LOGIC COMPUTATION IN MEMORY

This application claims the benefit of U.S. provisional application Ser. No. 63/302,548, filed Jan. 24, 2022, the subject matter of which is incorporated herein by reference.

BACKGROUND

Technical Field

The disclosure relates to a semiconductor circuit and an operating method for the same.

Description of the Related Art

A quantum annealing computer is known as a quantum computer that solves a discrete optimization problem using a quantum effect.

A physical system is designed in which a discrete variable is a physical state and a value of an objective function with respect to the discrete variable becomes the energy of the state. That is, energy is a function of the state. Thus, when the physical system can be transferred to a lowest energy state by any method, an optimum solution can be obtained by measuring the state. Quantum annealing using a quantum mechanical effect is known as a mechanism for transferring the physical system to the lowest energy state. It is known that the quantum annealing may solve a problem more efficiently than those that do not use the quantum mechanical effect.

In the quantum annealing, correspondence between the energy and the state is gradually changed in time by controlling an external potential field acting on a system. The quantum annealing is designed to change the potential and to finally achieve a relationship between the energy and the state corresponding to an objective function for which the optimum solution is actually investigated. When the initial state of the system is prepared to be the lowest energy state determined by the initial potential and then the potential is changed sufficiently slowly, the state traces the lowest energy state determined by the potential at each moment, which is known as a result of quantum mechanics. In this manner, it is possible to obtain a state that minimizes the objective function to be finally examined.

SUMMARY

The present disclosure relates to a semiconductor circuit and an operating method for the same.

According to an embodiment, a semiconductor circuit is provided. The semiconductor circuit comprising strings. The strings comprise a first string and a second string. The first string comprises a first device unit and a second device unit in series. The first string has a weight signal W1. The first device unit has an input signal A. The second device unit has an input signal B. The second string comprises a third device unit and a fourth device unit in series. The second string has a weight signal W2. The third device unit has an input signal $\overline{A}$. The fourth device unit has an input signal $\overline{B}$. An output signal of the semiconductor circuit is a sum of output string signals of the strings. The output string signals of the strings comprise an output string signal of the first string and an output string signal of the second string. The output string signal of the first string is "W1*(A AND B)" or "A AND (W1*B)". The output string signal of the second string is "W2*($\overline{A}$ AND $\overline{B}$ )" or "$\overline{A}$ AND (W2*$\overline{B}$ )".

According to another embodiment, an operating method for a semiconductor circuit is provided, comprising the following steps. A first string is used to compute a weight signal W1 input to the first string, an input signal A input to a first device unit of the first string, and an input signal B input to a second device of the first string to obtain an output string signal being "W1*(A AND B)" or "A AND (W1*B)". A second string is used to compute a weight signal W2 input to the second string, an input signal $\overline{A}$ input to a third device unit of the second string, and an input signal $\overline{B}$ input to a fourth device of second first string to obtain another output string signal being "W2*($\overline{A}$ AND $\overline{B}$ " or "$\overline{A}$ AND (W2*$\overline{B}$ )". The output string signal of the first string and the another output string signal of the second string are summed up.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
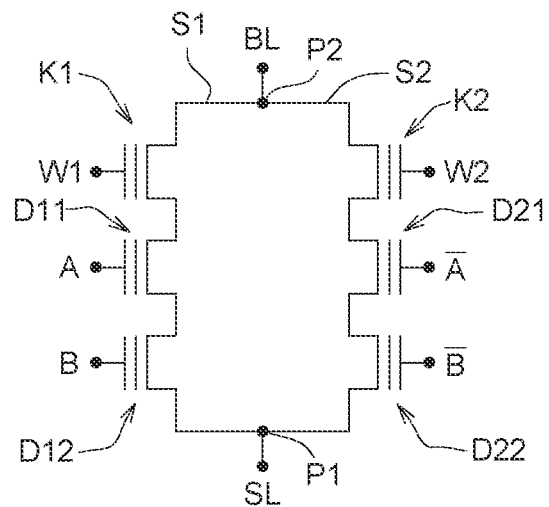
FIG. 1 illustrates a semiconductor circuit in an embodiment.

FIG. 1 illustrates a semiconductor circuit in an embodiment. A string group comprises a first string S1 and a second string S2. The first string S1 and the second string S2 are NAND strings. The first string S1 comprises a first device unit D11, a second device unit D12 and a first weight unit K1 electrically connected in series. The second string S2 comprises a third device unit D21, a fourth device unit D22 and a second weight unit K2 electrically connected in series. The first string S1, the second string S2 and a source line SL have a first node P1 therebetween. The first string S1, the second string S2 and a bit line BL have a second node P2 therebetween. The first string S1 and the second string S2 are electrically connected in parallel between the first node P1 and the second node P2.

The first weight unit K1 of the first string S1 is electrically connected between the second node P2 and the first device unit D11. The first weight unit K1 has a weight signal W1. The second weight unit K2 of the second string S2 is electrically connected between the second node P2 and the third device unit D21. The second weight unit K2 has a weight signal W2. The weight unit (the first weight unit K1/the second weight unit K2) is a memory unit. By providing a reading voltage (Vread) equal to or higher than a threshold voltage of the weight unit to a gate electrode line of the weight unit (i.e. a word line of the memory unit), the weight unit can be turned on (i.e. having a channel in a conducting state), producing the weight signal (weight signal W1/weight signal W2) being a value "1". By providing a reading voltage lower than the threshold voltage of the weight unit to the gate electrode line of the weight unit, the weight unit can be turned off (i.e. having a channel in a non-conducting state), producing the weight signal being a value "0". In this embodiment, the reading voltage provided to the weight unit is 0.5V to 7V.

The first device unit D11 and the second device unit D12 are memory units. A logic AND operation is performed with the input signal A of the first device unit D11 and the input signal B of the second device unit D12 to produce a first output logic signal "A AND B". A product of the first output logic signal "A AND B" and the weight signal W1 is an output string signal of the first string S1. In other words, the output string signal of the first string S1 is "W1*(A AND B)".

The third device unit D21 and the fourth device unit D22 are memory units. A logic AND operation is performed with the input signal $\overline{A}$ of the third device unit D21 and the input signal B of the fourth device unit D22 to produce a second output logic signal "$\overline{A}$ AND $\overline{B}$". A product of the second output logic signal "$\overline{A}$ AND $\overline{B}$" and the weight signal W2 is an output string signal of the second string S2. In other words, the output string signal of the second string S2 is "W2*($\overline{A}$ AND $\overline{B}$)".

An output signal of the first node P1 is a sum of the output string signal of the first string S1 and the output string signal of the second string S2. In other words, the output signal of the first node P1 is "W1*(A AND B)+W2*($\overline{A}$ AND $\overline{B}$)".

When the weight signal W1 of the first weight unit K1 is "1", and the weight signal W2 of the second weight unit K2 is "1", the output signal of the first node P1 is "A XNOR B". When the weight signal W1 of the first weight unit K1 is "1", and the weight signal W2 of the second weight unit K2 is "0", the output signal of the first node P1 is "A AND B". The output signal of the first node P1 can be referred to as an output signal of the string group. The output signal of the first node P1 may be an electric current (Id).

In embodiments, a quantum annealing computing can be realized by the semiconductor circuit. For example, the quantum annealing computing may be performed with applying the Ising model so as to obtain the optimal solution.

An example using a mathematical model (M) shown as below is described. The first item of the mathematical model (M) is the interaction energy of the external magnetic field "$h_i$" and the spin ($\sigma_i$). The second item of the mathematical model (M) is the interaction energy over pairs of adjacent spins "$\sigma_i$", "$\sigma_j$", wherein the parameter $J_{ij}$ represents the spin-spin interaction. The spin can be represented by the value "+1" and the value "−1", respectively indicating the spin "up" and the spin "down".

$$L_i = h_i \sigma_i + \sum_{j>i}^{n} J_{ij} \sigma_i \sigma_j \qquad \text{Mathematical Model (M)}$$

In an embodiment, the output signal "A AND B" of the first node P1 can be equal to the signal "$\sigma_i$ AND $\sigma_j$", which is relevant to the parameter "$h_i$" in the mathematical model (M). When the first device unit D11 and the second device unit D12 of the first string S1 have a low threshold voltage (Vlow) (such as a negative voltage, such as −3.5V to −0.5V), and the third device unit D21 and the fourth device unit D22 of the second string S2 have a high threshold voltage (Vhigh) (such as a positive voltage, such as 1V to 4.5V), the parameter "$h_i$" in the mathematical model (M) is "1". When the first device unit D11 and the second device unit D12 of the first string S1 and the third device unit D21 and the fourth device unit D22 of the second string S2 have a high threshold voltage (Vhigh) (such as 1V to 4.5V), the parameter "$h_i$" in the mathematical model (M) is "0". The table 1 lists the relation between the threshold voltage of the device unit and the parameter "$h_i$" of the mathematical model (M) in an "AND" mode for the string group described herein. In the table 1, the threshold voltage "Vt1" indicates the threshold voltages of the first device unit D11 and the second device unit D12 of the first string S1. The threshold voltage "Vt2" indicates the threshold voltages of the third device unit D21 and the fourth device unit D22 of the second string S2.

In an embodiment, the output signal "A XNOR B" of the first node P1 can be equal to the signal "$\sigma_i$ XNOR $\sigma_j$", which is relevant to the parameter "$J_{ij}$" in the mathematical model (M). When the first device unit D11 and the second device unit D12 of the first string S1 and the third device unit D21 and the fourth device unit D22 of the second string S2 have a low threshold voltage (Vlow) (such as a negative voltage, such as −3.5V to −0.5V), the parameter "Ji" in the mathematical model (M) is "1". When the first device unit D11 and the second device unit D12 of the first string S1 and the third device unit D21 and the fourth device unit D22 of the second string S2 have a high threshold voltage (Vhigh) (such as 1V to 4.5V), the parameter "$J_{ij}$" in the mathematical model (M) is "0". The table 1 lists the relation between the threshold voltage of the device unit and the parameter "$J_{ij}$"

of the mathematical model (M) in an "XNOR" mode for the string group described herein.

TABLE 1

| operation mode | threshold voltage | parameter |
| --- | --- | --- |
| "XNOR" mode | Vt1 = Vt2 = Vlow | J = 1 |
| | Vt1 = Vt2 = Vhigh | J = 0 |
| "AND" mode | Vt1 = Vlow | h = 1 |
| | Vt2 = Vhigh | |
| | Vt1 = Vt2 = Vhigh | h = 0 |

Figure 14:
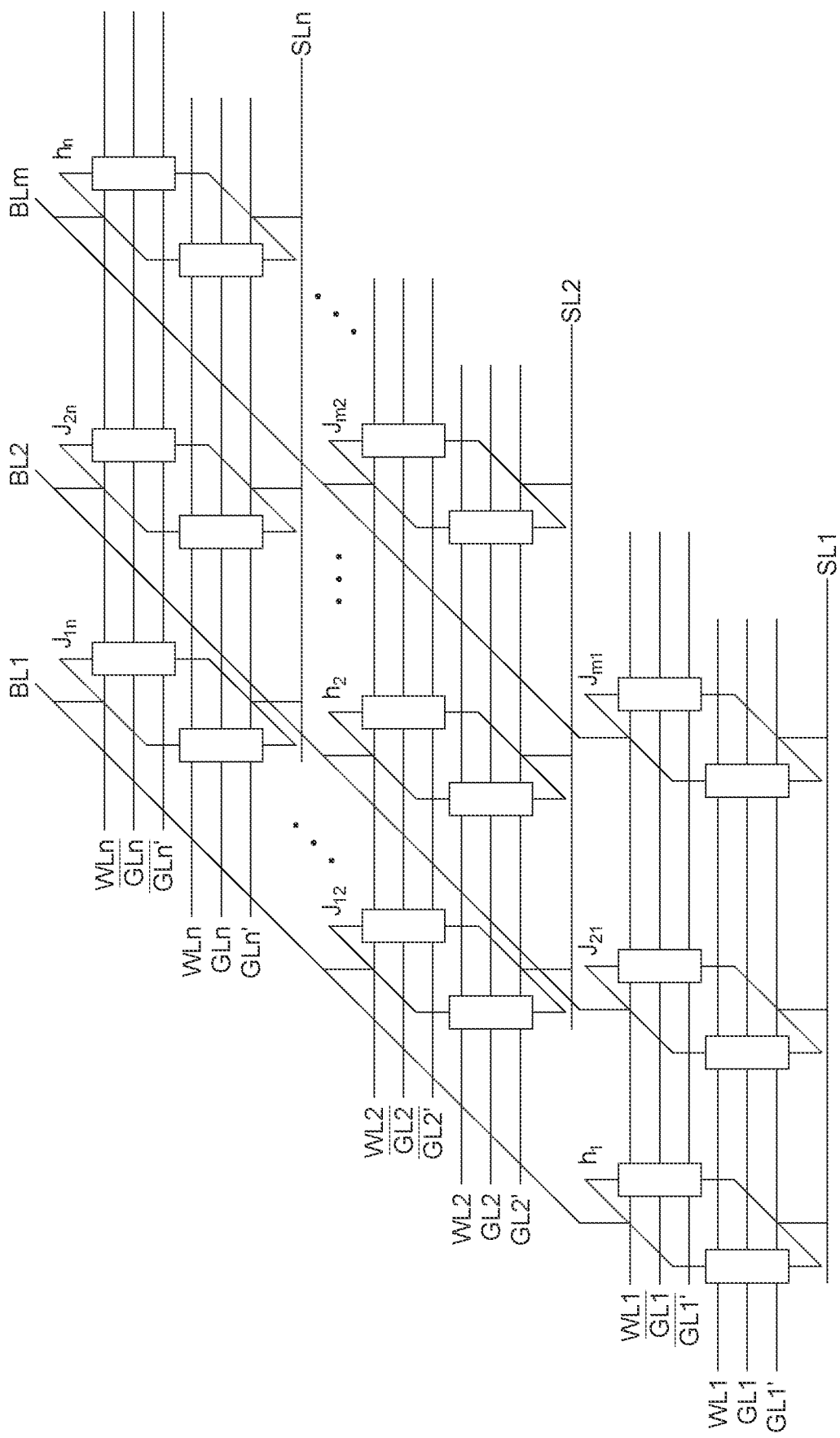
FIG. 14 illustrates a semiconductor circuit in an embodiment.

In embodiments, the input signals are gate voltages provided to the device units. For example, the input signal A is a gate voltage applied to the first device unit D11 (such as gate voltages applied to gate electrode lines GL1, GL2, ... GLn as shown in FIG. 14). The input signal B is a gate voltage applied to the second device unit D12 (such as gate voltages applied to gate electrode lines GL1', GL2', ... GLn' as shown in FIG. 14). The input signal $\overline{A}$ is a gate voltage applied to the first device unit D21 (such as gate voltages applied to gate electrode lines $\overline{GL1}$, $\overline{GL2}$, ... $\overline{GLn}$ as shown in FIG. 14). The input signal $\overline{B}$ is a gate voltage applied to the first device unit D22 (such as gate voltages applied to gate electrode lines $\overline{GL1'}$, $\overline{GL2'}$, ... $\overline{GLn'}$ as shown in FIG. 14). When the gate voltage provided to the device unit is a reading voltage (Vread) (such as a positive voltage, such as 0.5V to 7V), the variable "$\sigma_i$" and the variable "$\sigma_j$" in the mathematical model (M) are "1". When the gate voltage provided to the device unit is 0V, the variable "$\sigma_i$" and the variable "$\sigma_j$" in the mathematical model (M) are "−1". The table 2 shows the relation described herein.

TABLE 2

| | gate voltage | spin |
| --- | --- | --- |
| device unit | Vread | "1" |
| | 0 | "−1" |

In embodiments, when the device unit and/or the weight unit have a negative threshold voltage, the operation can be realized with using a lower reading voltage, which can achieve a lower power consumption.

Figure 2:
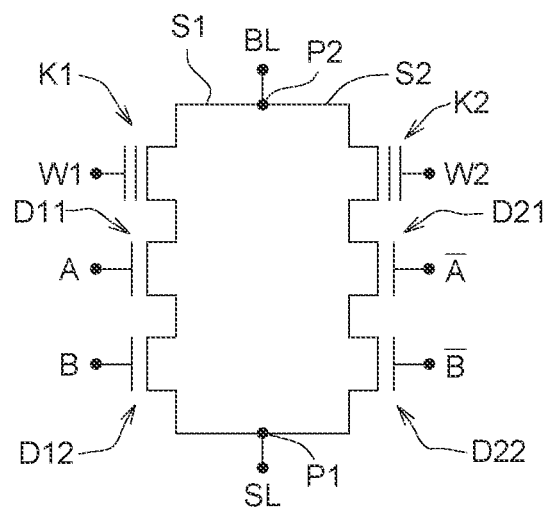
FIG. 2 illustrates a semiconductor circuit in another embodiment.

FIG. 2 illustrates a semiconductor circuit in another embodiment, which is different from the semiconductor circuit in FIG. 1 in that the first device unit D11, the second device unit D12, the third device unit D21 and the fourth device unit D22 are transistors. In this embodiment, when the gate voltage provided to the device unit is a positive voltage, such as 0.5V to 5V, the variable "$\sigma_i$" and the variable "$\sigma_j$" in the mathematical model (M) are "1". When the gate voltage provided to the device unit is 0V, the variable "$\sigma_i$" and the variable "$\sigma_j$" in the mathematical model (M) are "−1". The table 3 shows the relation described herein. In an embodiment, a reading voltage provided to the weight unit is 0.5V to 7.5V.

TABLE 3

| | gate voltage | spin |
| --- | --- | --- |
| device unit | VG | "1" |
| | 0 | "−1" |

Figure 3:
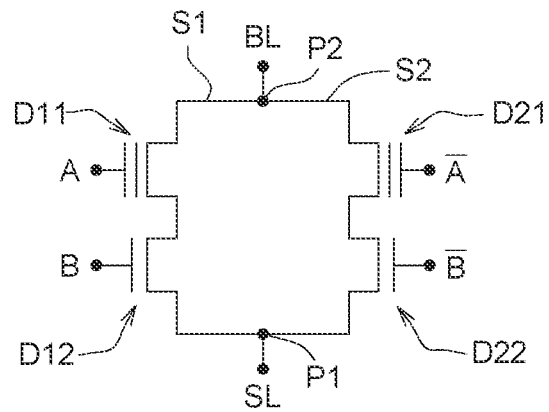
FIG. 3 illustrates a semiconductor circuit in yet another embodiment.

FIG. 3 illustrates a semiconductor circuit in yet another embodiment. In this embodiment, the first string S1 comprises the first device unit D11 and the second device unit D12 electrically connected in series. The second string S2 comprises the third device unit D21 and the fourth device unit D22 electrically connected in series. The first device unit D11 and the third device unit D21 are memory units. The second device unit D12 and the fourth device unit D22 are transistor.

In an embodiment, the first device unit D11 has the input signal A and the weight signal W1 corresponding to the gate voltage (GV). The second device unit D12 has the input signal B corresponding to the gate voltage (GV). A logic AND operation is performed with the input signal A of the first device unit D11 and a product of the weight signal W1 and the input signal B of the second device unit D12 to produce the output string signal "A AND (W1*B)" of the first string S1. The third device unit D21 has the input signal $\overline{A}$ and the weight signal W2 corresponding to the gate voltage (GV). The fourth device unit D22 has the input signal $\overline{B}$ corresponding to the gate voltage (GV). A logic AND operation is performed with the input signal $\overline{A}$ of the first device unit D21 and a product of the weight signal W2 and the input signal $\overline{B}$ of the first device unit D22 to produce the output string signal "$\overline{A}$ AND (W2*$\overline{B}$)" of the second string S2. The output signal of the first node P1 is the sum of the output string signal of the first string S1 and the output string signal of the second string S2, being "A AND (W1*B)+$\overline{A}$ AND (W2*$\overline{B}$)".

By providing a gate voltage (VG) equal to or higher than a threshold voltage of the device unit to the device unit, the device unit can be turned on (i.e. having a channel in a conducting state), producing the weight signal (weight signal W1/weight signal W2) being a value "1". By providing the gate voltage (VG) lower than the threshold voltage of the device unit to the device unit, the device unit can be turned off (i.e. having the channel in a non-conducting state), producing the weight signal being a value "0". As such, in this embodiment, the output signal of the first node P1 can also be "W1*(A AND B)+W2*($\overline{A}$ AND $\overline{B}$)". When the weight signal W1 of the first device unit D11 is "1", and the weight signal W2 of the third device unit D21 is "1", the output signal of the first node P1 is "A XNOR B". When the weight signal W1 of the first device unit D11 is "1", and the weight signal W2 of the third device unit D21 is "0", the output signal of the first node P1 is "A AND B".

In embodiments, the quantum annealing computing can be realized by the semiconductor circuit. In an embodiment, when the output signal of the first node P1 of the string group is "A AND B", it can be equal to "$\sigma_i$ AND $\sigma_j$" relevant to parameter "$h_i$" in the mathematical model (M). The table 1 lists the relation between the threshold voltage of the device unit and the parameter "$h_i$" of the mathematical model (M) in an "AND" mode for the string group described herein. In an embodiment, when the output signal of the first node P1 of the string group is "A XNOR B", it can be equal to "$\sigma_i$ XNOR $\sigma_j$" relevant to parameter "$J_{ij}$" in the mathematical model (M). The table 1 lists the relation between the threshold voltage of the device unit and the parameter "$J_{ij}$" of the mathematical model (M) in an "XNOR" mode for the string group described herein. In this embodiment, the high threshold voltage (Vhigh) is 1V to 4.5V, for example. The low threshold voltage (Vhigh) is −3.5V to −0.5V, for example.

When the gate voltages (VG) provided to the first device unit D11 and the third device unit D21 are 0.5V to 7V, the variable "$\sigma_i$" and the variable "$\sigma_j$" in the mathematical model (M) are "1". When the gate voltages (VG) provided to the first device unit D11 and the third device unit D21 are 0V, the variable "$\sigma_i$" and the variable "$\sigma_j$" in the mathematical model (M) are "−1". The table 3 shows the relation described herein. When the gate voltages provided to the second device unit D12 and the fourth device unit D22 are reading voltages (Vread) (such as a positive voltage, such as 0.5V to 7.5V), the variable "$\sigma_i$" and the variable "$\sigma_j$" in the mathematical model (M) are "1". When the gate voltages provided to the second device unit D12 and the fourth device unit D22 are 0V, the variable "$\sigma_i$" and the variable "$\sigma_j$" in the mathematical model (M) are "−1". The table 4 shows the relation described herein.

TABLE 4

|  | gate voltage | spin |
|---|---|---|
| device unit D11, D21 | VG | "1" |
|  | 0 | "−1" |
| device unit D21, D22 | Vread | "1" |
|  | 0 | "−1" |

Figure 15:
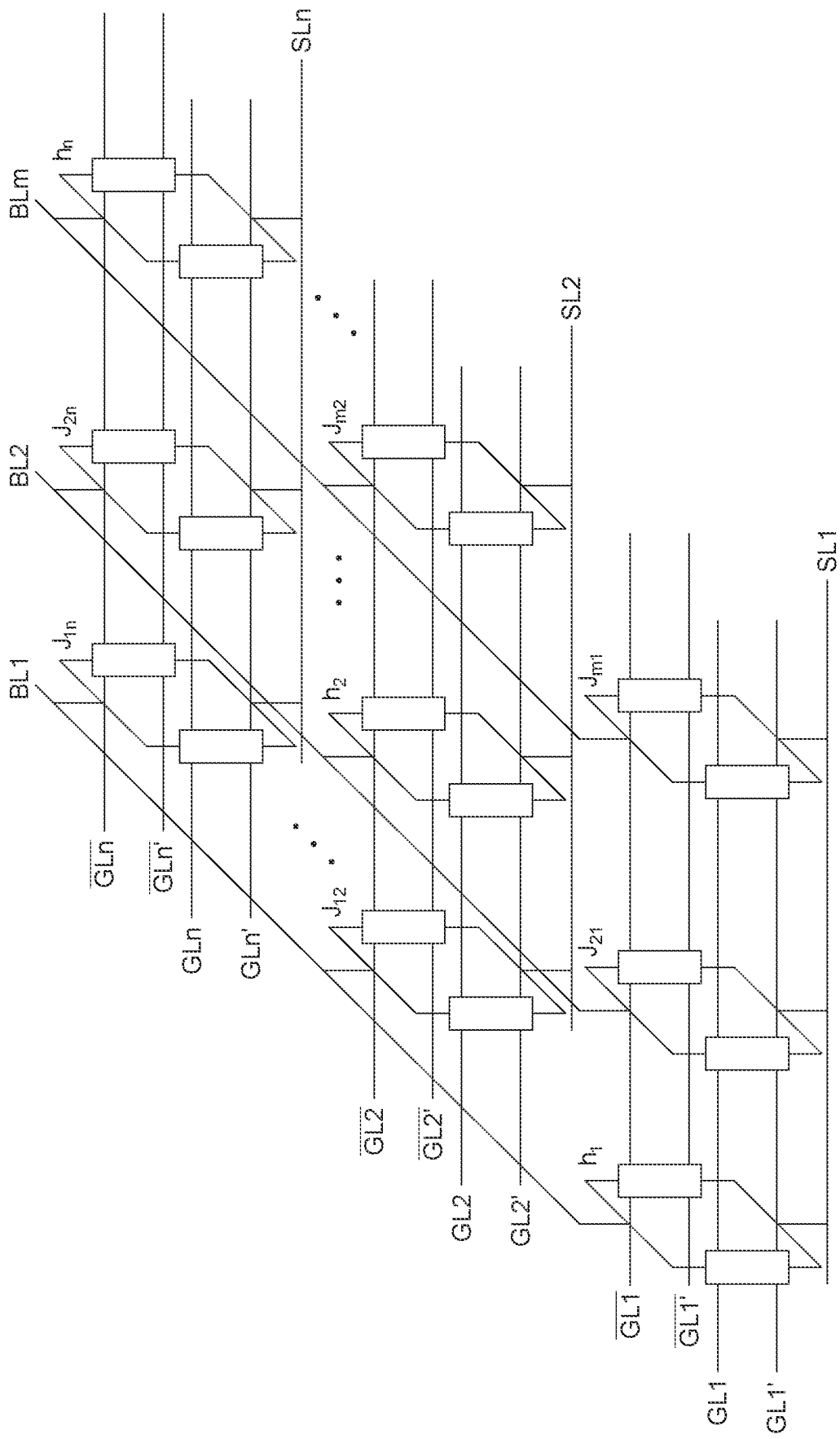
FIG. 15 illustrates a semiconductor circuit in an embodiment.

The gate voltage applied to the first device unit D11 can be gate voltages applied to gate electrode lines GL1, GL2, . . . GLn as shown in FIG. 15. The gate voltage applied to the second device unit D12 can be gate voltages applied to gate electrode lines GL1', GL2', . . . GLn' as shown in FIG. 15. The gate voltage applied to the third device unit D21 can be gate voltages applied to gate electrode lines $\overline{GL1}$, $\overline{GL2}$, . . . $\overline{GLn}$ as shown in FIG. 15. The gate voltage applied to the fourth device unit D22 can be gate voltages applied to gate electrode lines $\overline{GL1'}$, $\overline{GL2'}$, . . . $\overline{GLn'}$ as shown in FIG. 15.

Figure 4:
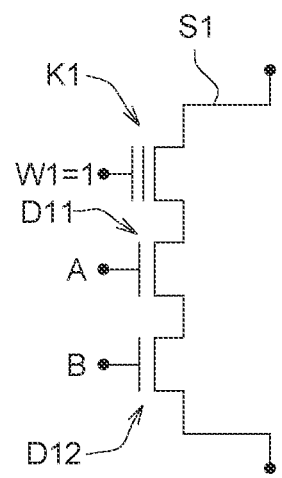
FIG. 4 illustrates a semiconductor circuit in an embodiment.

FIG. 4 illustrates a semiconductor circuit in an embodiment. A logic AND operation is performed with the input signal A of the first device unit D11 and the input signal B of the second device unit D12 of the first string S1 to produce the signal "A AND B". The weight signal W1 of the first weight unit K1 of the first string S1 is "1". The output string signal of the first string S1 is "W1*(A AND B)", equal to "A AND B".

Figure 5:
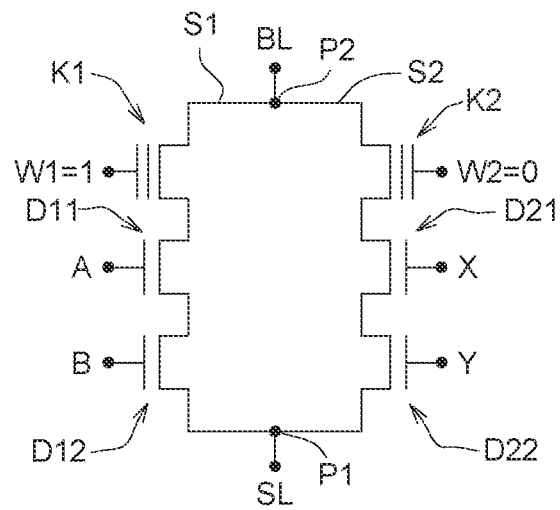
FIG. 5 illustrates a semiconductor circuit in an embodiment.

FIG. 5 illustrates a semiconductor circuit in an embodiment. A logic AND operation is performed with the input signal A of the first device unit D11 and the input signal B of the second device unit D12 of the first string S1 to produce the signal "A AND B". The weight signal W1 of the first weight unit K1 of the first string S1 is "1". Therefore, the output string signal of the first string S1 is "A AND B". The weight signal W2 of the second weight unit K2 of the second string S2 is "0". Therefore, the output signal of the first node P1 is the output string signal "A AND B" of the first string S1 regardless of the input signal X of the third device unit D21 and the input signal Y of the fourth device unit D22.

Figure 6:
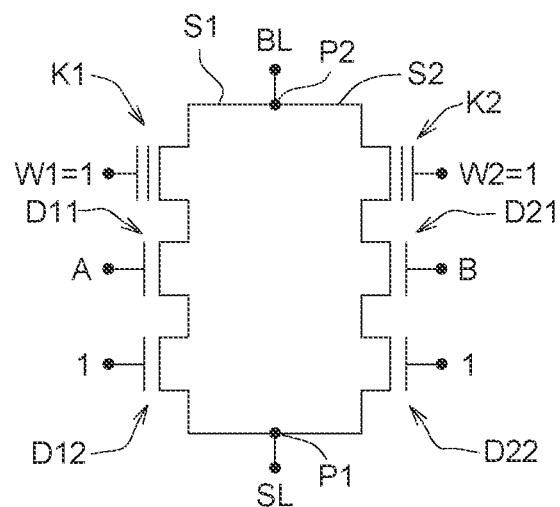
FIG. 6 illustrates a semiconductor circuit in an embodiment.

FIG. 6 illustrates a semiconductor circuit in an embodiment. The first device unit D11 of the first string S1 has the input signal A, and the second device unit D12 of the first string S1 has the weight signal "1". The weight signal W1 of the first weight unit K1 of the first string S1 is "1". Therefore, the output string signal of the first string S1 is "A". The third device unit D21 of the second string S2 has the input signal B, and the fourth device unit D22 of the second string S2 has the weight signal "1". The weight signal W2 of the second weight unit K2 of the second string S2 is "1". Therefore, the output string signal of the second string S2 is "B". In this embodiment, the output signal of the first node P1 is "A+B", and is also "A OR B".

Figure 7:
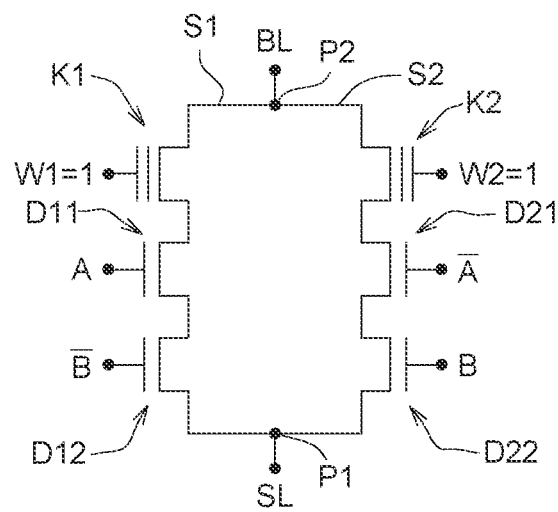
FIG. 7 illustrates a semiconductor circuit in an embodiment.

FIG. 7 illustrates a semiconductor circuit in an embodiment. The first device unit D11 of the first string S1 has the input signal A, and the second device unit D12 of the first string S1 has the input signal $\overline{B}$. A logic AND operation is performed with the input signal A and the input signal B to produce the signal "A AND $\overline{B}$". The weight signal W1 of the first weight unit K1 of the first string S1 is "1". Therefore, the output string signal of the first string S1 is "A AND $\overline{B}$". The third device unit D21 of the second string S2 has the input signal $\overline{A}$, and the fourth device unit D22 of the second string S2 has the input signal B. A logic AND operation is performed with the input signal $\overline{A}$ and the input signal B to produce the signal "$\overline{A}$ AND B". The weight signal W2 of the second weight unit K2 of the second string S2 is "1". Therefore, the output string signal of the second string S2 is "$\overline{A}$ AND B". In this embodiment, the output signal of the first node P1 is "$\overline{A}$ AND B+$\overline{A}$ AND B", and is also "A XOR B".

Figure 8:
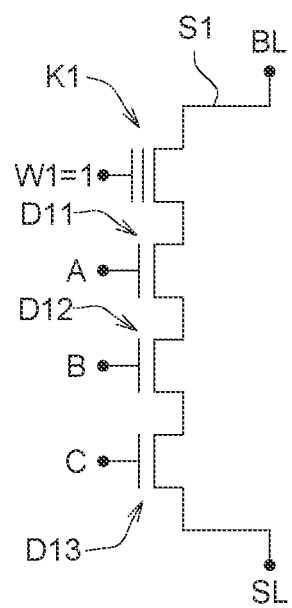
FIG. 8 illustrates a semiconductor circuit in an embodiment.

FIG. 8 illustrates a semiconductor circuit in an embodiment. A logic AND operation is performed with the input signal A of the first device unit D11, the input signal B of the second device unit D12 and the input signal C of a device unit D13 of the first string S1 to produce the signal "A AND B AND C". The weight signal W1 of the first weight unit K1 of the first string S1 is "1". Therefore, the output string signal of the first string S1 is "A AND B AND C".

Figure 9:
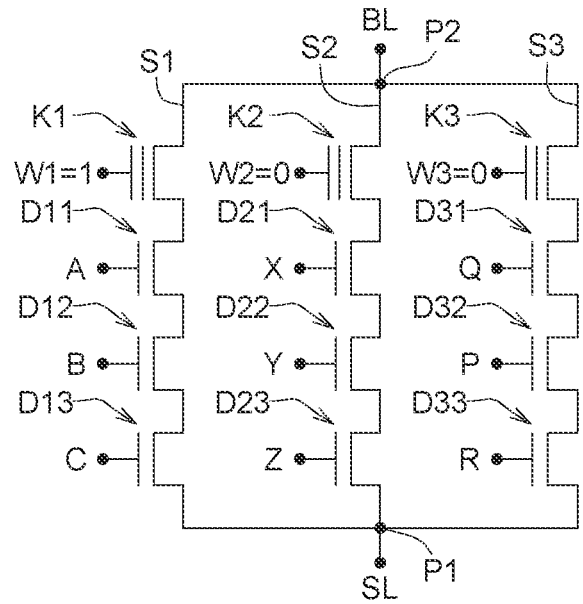
FIG. 9 illustrates a semiconductor circuit in an embodiment.

FIG. 9 illustrates a semiconductor circuit in an embodiment. A logic AND operation is performed with the input signal A of the first device unit D11, the input signal B of the second device unit D12 and the input signal C of the device unit D13 of the first string S1 to produce the signal "A AND B AND C". The weight signal W1 of the first weight unit K1 of the first string S1 is "1". Therefore, the output string signal of the first string S1 is "A AND B AND C". The weight signal W2 of the second weight unit K2 of the second string S2 is "0", and a weight signal W3 of a third weight unit K3 of a third string S3 is "0". Therefore, the output signal of the first node P1 is the output string signal "A AND B AND C" of the first string S1, regardless of the signal X of the third device unit D21, the signal Y of the fourth device unit D22, the signal Z of the device unit D23, the signal Q of the device unit D31, the signal P of the device unit D32, and the signal R of the device unit D33.

Figure 10:
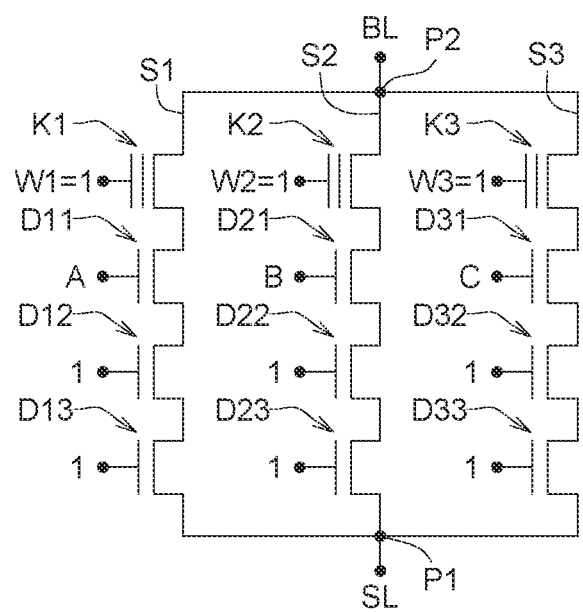
FIG. 10 illustrates a semiconductor circuit in an embodiment.

FIG. 10 illustrates a semiconductor circuit in an embodiment. The first device unit D11 of the first string S1 has the input signal A, the second device unit D12 of the first string S1 has the weight signal "1", and the device unit D13 of the first string S1 has the weight signal "1". The weight signal W1 of the first weight unit K1 of the first string S1 is "1". Therefore, the output string signal of the first string S1 is "A". The third device unit D21 of the second string S2 has the input signal B, the fourth device unit D22 of the second string S2 has the weight signal "1", and the device unit D23 of the second string S2 has the weight signal "1". The weight signal W2 of the second weight unit K2 of the second string S2 is "1". Therefore, the output string signal of the second string S2 is "B". The device unit D31 of the third string S3 has the input signal C, the device unit D32 of the third string S3 has the weight signal "1", and the device unit D33 of the third string S3 has the weight signal "1". The weight signal W3 of the third weight unit K3 of the third string S3 is "1". Therefore, output string signal of the third string S3 is "C".

In this embodiment, the output signal of the first node P1 is "A+B+C", and also is "A OR B OR C".

Figure 11:
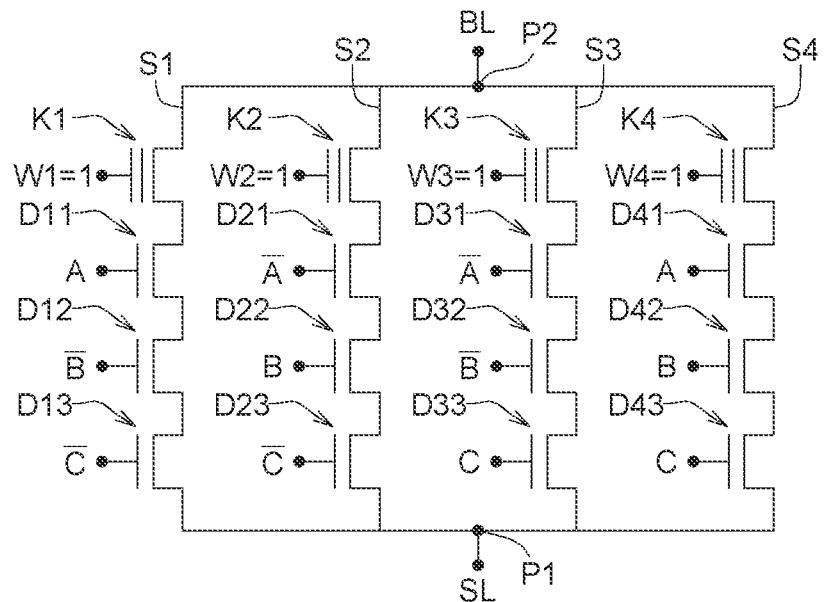
FIG. 11 illustrates a semiconductor circuit in an embodiment.

FIG. 11 illustrates a semiconductor circuit in an embodiment. A logic AND operation is performed with the input signal A of the first device unit D11, the input signal $\overline{B}$ of the second device unit D12 and the input signal $\overline{C}$ of the device unit D13 of the first string S1 to produce the signal "A AND $\overline{B}$ AND $\overline{C}$". The weight signal W1 of the first weight unit K1 of the first string S1 is "1". Therefore, the output string signal of the first string S1 is "A AND $\overline{B}$ AND $\overline{C}$". By analogy, it could be understood that in FIG. 11 the output string signal of the second string S2 is "$\overline{A}$ AND B AND $\overline{C}$", the output string signal of the third string S3 is "$\overline{A}$ AND $\overline{B}$ AND C", and the output string signal of the fourth string S4 is "A AND B AND C". In this embodiment, the output signal of the first node P1 is "A AND $\overline{B}$ AND $\overline{C}$ + $\overline{A}$ AND B AND $\overline{C}$ + $\overline{A}$ AND $\overline{B}$ AND C+A AND B AND C". The fourth string S4 comprises the fourth weight unit K4, the device unit D41, the device unit D42, and the device unit D43 electrically connected in series.

Figure 12:
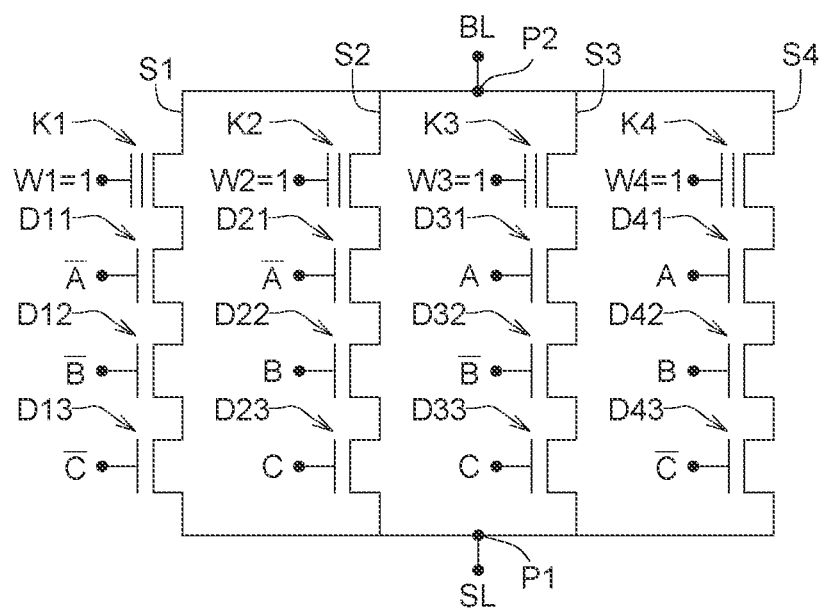
FIG. 12 illustrates a semiconductor circuit in an embodiment.

FIG. 12 illustrates a semiconductor circuit in an embodiment. The output string signal of the first string S1 is "$\overline{A}$ AND $\overline{B}$ AND $\overline{C}$". The output string signal of the second string S2 is "$\overline{A}$ AND B AND C". The output string signal of the third string S3 is "A AND $\overline{B}$ AND C". The output string signal of the fourth string S4 is "A AND B AND $\overline{C}$". In this embodiment, the output signal of the first node P1 is "$\overline{A}$ AND $\overline{B}$ AND $\overline{C}$ +$\overline{A}$ AND BAND C+A AND $\overline{B}$ AND C+A AND B AND $\overline{C}$".

Figure 13:
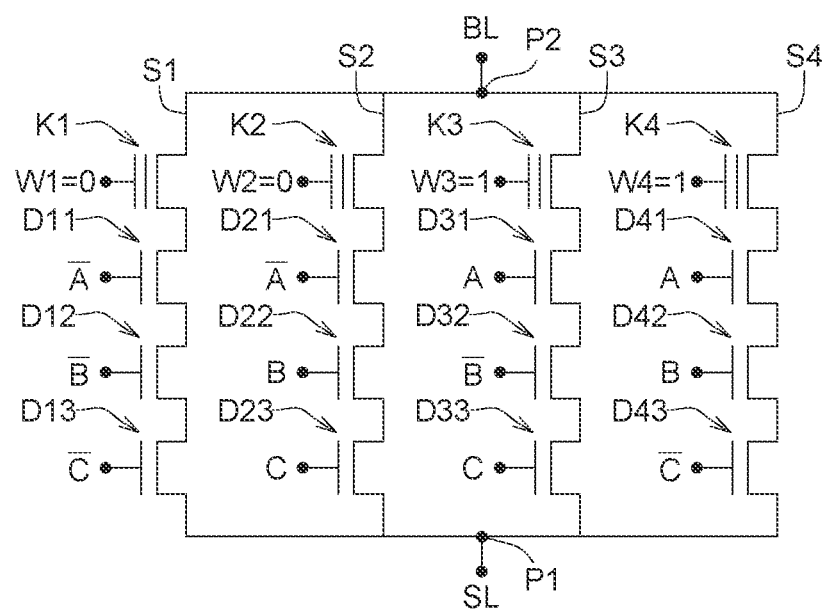
FIG. 13 illustrates a semiconductor circuit in an embodiment.

FIG. 13 illustrates a semiconductor circuit in an embodiment. In this embodiment, the weight signal W1 of the first weight unit K1 of the first string S1 and the weight signal W2 of the second weight unit K2 of the second string S2 are "0". The weight signal W3 of the third weight unit K3 of the third string S3 and the weight signal W4 of the fourth weight unit K4 of the fourth string S4 are "1". Therefore, the output signal of the first node P1 is the sum of the output string signal "A AND $\overline{B}$ AND C" of the third string S3 and the output string signal "A AND B AND $\overline{C}$" of the fourth string S4. In other words, the output signal of the first node P1 is "(A AND $\overline{B}$ AND C)+(A AND B AND $\overline{C}$ )", and is "A AND B XOR C".

In the present disclosure, the quantity of the device unit and the weight unit of each string of the string group is not limited, and can be one, two, three, four or more. The quantity of the string (such as NAND string) of each string group is not limited, and can be one, two, three, four or more. The device unit and the weight unit can be individually a transistor (or transistor unit) or a memory unit (or memory cell). As the device unit is the memory unit, the gate electrode line of which can be referred to as word line (WL). The memory unit may be a non-volatile memory, such as a flash memory cell. The memory unit may have a floating gate structure. The memory unit may have an oxide-nitride-oxide (ONO) gate stack structure. The transistor may be a ferroelectric field effect transistor (FEFET). However, the present disclosure is not limited thereto.

FIG. 14 illustrates a semiconductor circuit in an embodiment. FIG. 14 shows the semiconductor circuit comprises an array of m*n string groups.

The bit lines BLi are electrically connected to the string groups relevant to the parameter "$h_i$" and the parameter "$J_{ij}$" in the mathematical model (M). The string groups are at intersections of the bit lines BLi and the source lines SLj. i is an integer of 1 to m. j an integer of 1 to n. For example, the bit line BL1 is electrically connected with the string groups relevant to the parameter "$h_1$" and the parameters "$J_{12}$" to "$J_{1n}$". The bit line BL2 is electrically connected with the string groups relevant to the parameter "$h_2$" and the parameters "$J_{21}$" to "$J_{2n}$". The bit line BLm is electrically connected with the string groups relevant to the parameter "$h_m$" and the parameters "$J_{m1}$" to "$J_{mn}$". In embodiments, the array of the string groups as shown in FIG. 14 may be used to perform a quantum annealing operating applying the mathematical model (M) for obtaining an optimal solution efficiently.

In an embodiment, the string groups can have the circuit as shown in FIG. 1, and can be used to perform the operating according to the relations described with referring to the table 1 and the table 2. In another embodiment, the string groups can have the circuit as shown in FIG. 2, and can be used to perform the operating according to the relations described with referring to the table 1 and the table 3.

For example, for computing "$L_1$" of the mathematical model (M1), the bit line BL1 is selected; the gate voltages (the input signals) are provided to the gate electrode lines GL1, $\overline{GL1}$, GL2, $\overline{GL2}$, . . . GLn, and $\overline{GLn}$ for "$\sigma_i$"; and the gate voltages (the input signals) are provided to the gate electrode lines GL1', $\overline{GL1'}$ for "$\sigma_1$", the gate electrode lines GL2', $\overline{GL2}$ for "$\sigma_2$", . . . and the gate electrode lines GLn', $\overline{GLn}$ ' for "$\sigma_i$", respectively. The output signals of the source lines SL1, SL2 . . . and SLn can be added up to obtain the sum of the output signals of the string groups relevant to the parameter "$h_1$", and the parameters "$J_{12}$" to "$J_{1n}$", which is equal to the mathematical model (M1). The output terminals of the source lines SL1, SL2 . . . SLn may be electrically connected with a common source line. The output signal of the common source line is the sum of the output signals of the source lines SL1, SL2 . . . SLn.

$$L_1 = h_1\sigma_i + \sum_{j=2}^{m} J_{1j}\sigma_i\sigma_j \qquad \text{Mathematical Model (M1)}$$

FIG. 15 illustrates a semiconductor circuit in another embodiment. FIG. shows the m*n string groups of the semiconductor circuit. In an embodiment, the string groups may have the circuit as shown in FIG. 3. In an embodiment, the string groups can be used to perform the operating according to the relations described with referring to the table 1 and the table 4. In embodiments, the array of the string groups as shown in FIG. 15 may be used to perform a quantum annealing operating applying the mathematical model (M) for obtaining an optimal solution efficiently.

Figure 16:
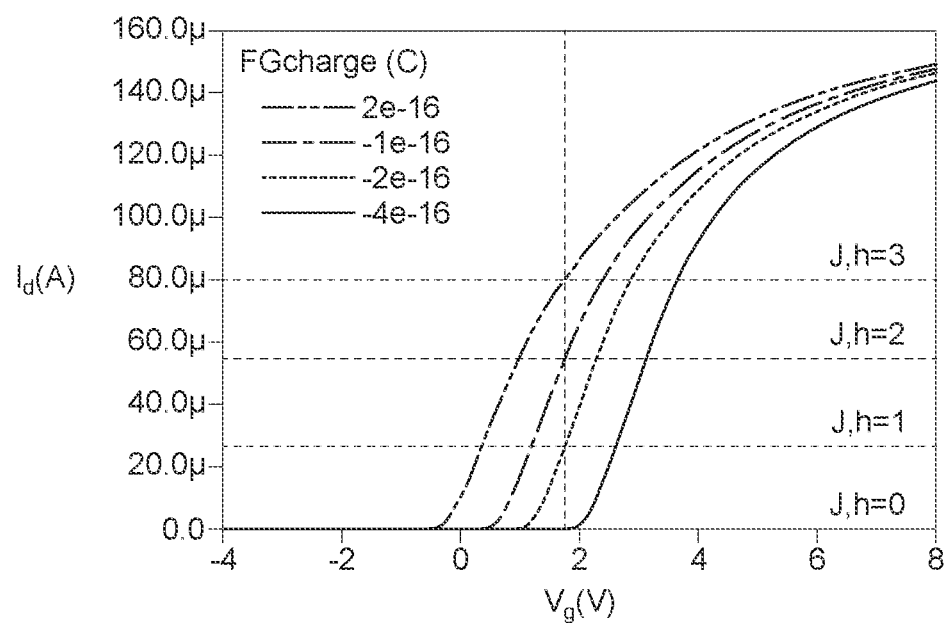
FIG. 16 shows an electric characteristic of a semiconductor circuit of an embodiment.

FIG. 16 shows an electric characteristic of a semiconductor circuit of an embodiment. The curve lines are Id-Vg curves of the flash memory cells. The vertical solid line indicates the voltage Vd. The horizontal lines indicates the output electric currents (Id) corresponding to the various parameter conditions (j,h). The results shown in FIG. 16 can demonstrate that the semiconductor circuit having the flash memory cells having the multi-level threshold voltages can be used to realize the logic operating.

Figure 17:
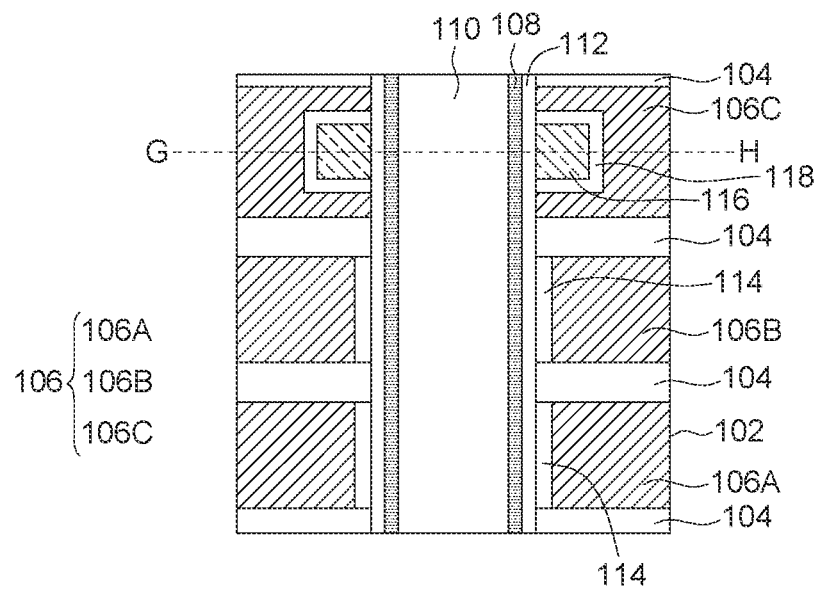
FIG. 17 illustrates a vertical cross-section view of a string group of a semiconductor circuit in an embodiment.
Figure 18:
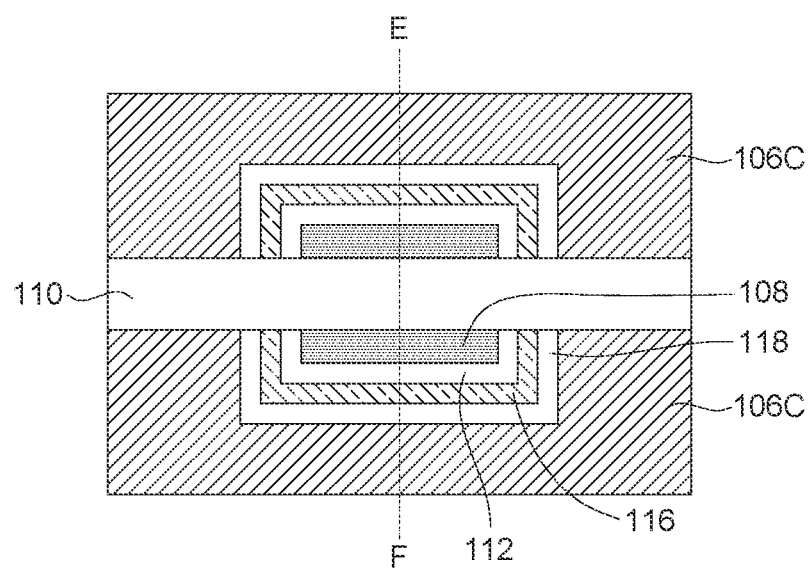
FIG. 18 illustrate a horizontal cross-section view of a string group of a semiconductor circuit in an embodiment.

FIG. 17 and FIG. 18 illustrate a vertical cross-section view and a horizontal cross-section view of the string group of the semiconductor circuit in an embodiment respectively. The vertical cross-section view of FIG. 17 is drawn along the EF line of FIG. 18. The horizontal cross-section view of FIG. 18 is drawn along the GH line of FIG. 17. A stacked structure 102 comprises insulating layers 104 and gate electrode layers 106 stacked alternately. The gate electrode layers 106 comprise a gate electrode layer 106A, a gate electrode layer 106B and a gate electrode layer 106C. A channel layer 108 is between an insulating element 110 and a dielectric film 112. The channel layer 108 comprises polysilicon or other suitable semiconductor materials. The dielectric film 112 may comprise an oxide such as silicon oxide. The dielectric film 112 may be a tunnelling oxide film. The insulating element 110 comprises an oxide such as silicon oxide. A dielectric film 114 is between the dielectric film 112 and the gate electrode layer 106A. The dielectric film 114 is between the dielectric film 112 and the gate electrode layer 106B. The dielectric film 114 may comprise an oxide such as silicon oxide. An electrode element 116 (such as a floating gate electrode) is between a dielectric film 118 and the dielectric film 112. The dielectric film 118 is between the gate electrode layer 106C and the electrode element 116. The dielectric film 118 may be a blocking layer. Each of the gate electrode layer 106A, the gate electrode layer 106B and the gate electrode layer 106C comprises gate electrode lines separated from each other by the insulating element 110. The string group of the semiconductor circuit shown by FIG. 17 and FIG. 18 has a vertical split-gate structure, having a small footprint and helping increase of device density.

FIG. 19 to FIG. 30 illustrates a manufacturing method for a string group a semiconductor circuit in an embodiment.

Figure 19:
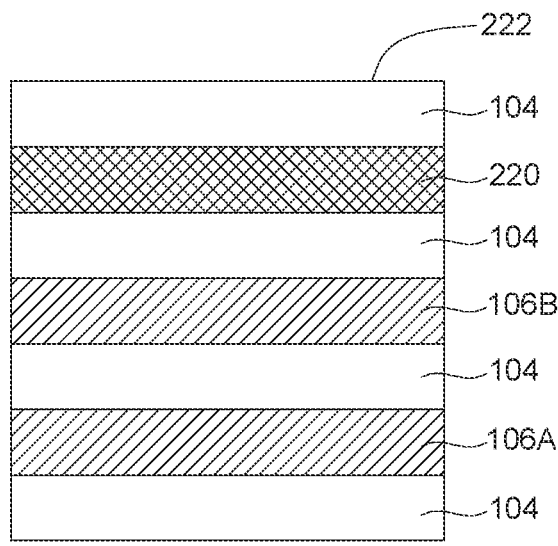
FIG. 19 to FIG. 30 illustrates a manufacturing method for a string group a semiconductor circuit in an embodiment.

Referring to FIG. 19, insulating layers and gate electrode layers are stacked to form a stacked structure 222. The insulating layers comprise the insulating layers 104 and the insulating layer 220. The gate electrode layers comprise the gate electrode layer 106A and the gate electrode layer 106B. The insulating layers 104 may comprise an oxide such as silicon oxide. The insulating layer 220 may comprise a nitride such as silicon nitride. The gate electrode layers may comprise polysilicon or other suitable semiconductor materials or conductive materials.

Figure 20:
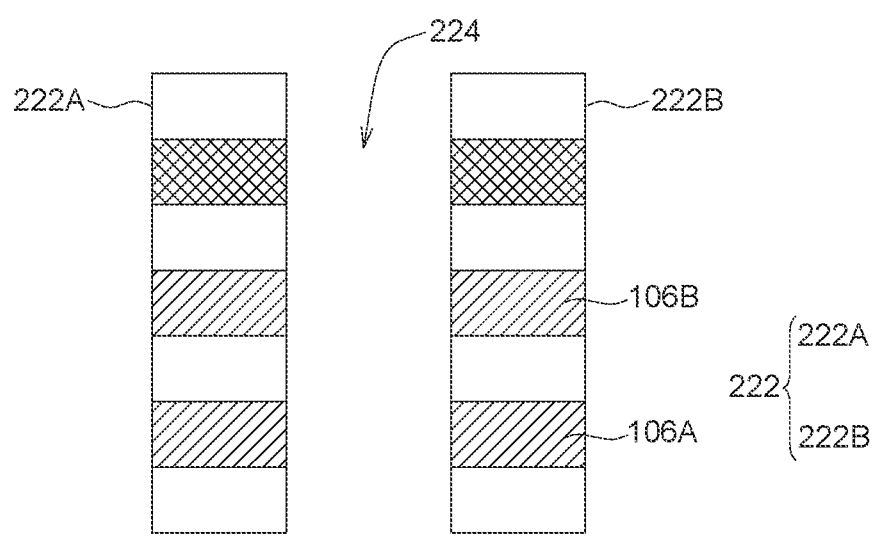

Referring to FIG. 20, an etching step is performed to the stacked structure 222 to form a trench 224. The etching step may stop on a substrate (such as a bottom oxide, not shown). A stacked structure 222A and a stacked structure 222B are separated from each other by the trench 224. Each of the gate electrode layer 106A and the gate electrode layer 106B comprises gate electrode lines separated from each other by the trench 224, respectively belonging to the stacked structure 222A and the stacked structure 222B.

Figure 21:
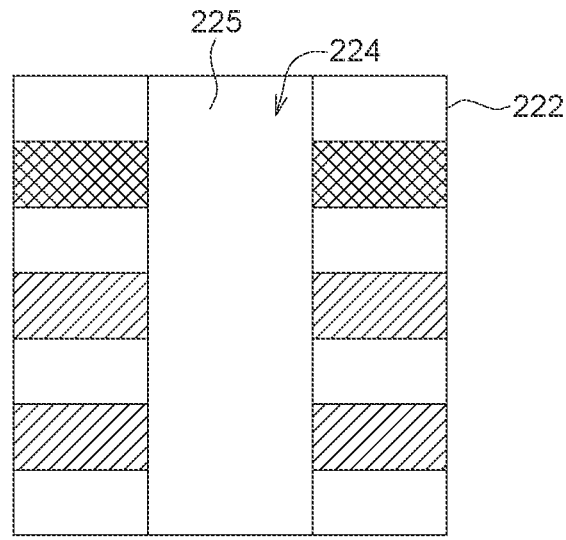

Referring to FIG. 21, an insulating element 225 is formed in the trench 224 of the stacked structure 222.

Figure 22:
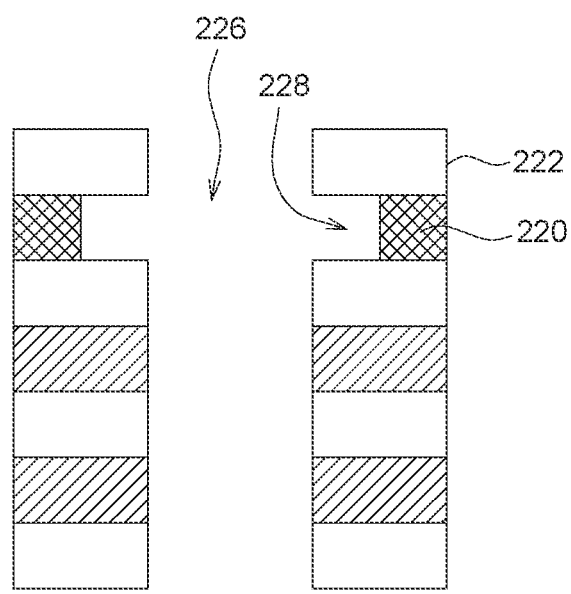

Referring to FIG. 22, an etching step is performed to form an opening 226 in the insulating element 225 and the stacked structure 222, and to etch back the insulating layer 220 to form a slit 228.

Figure 23:
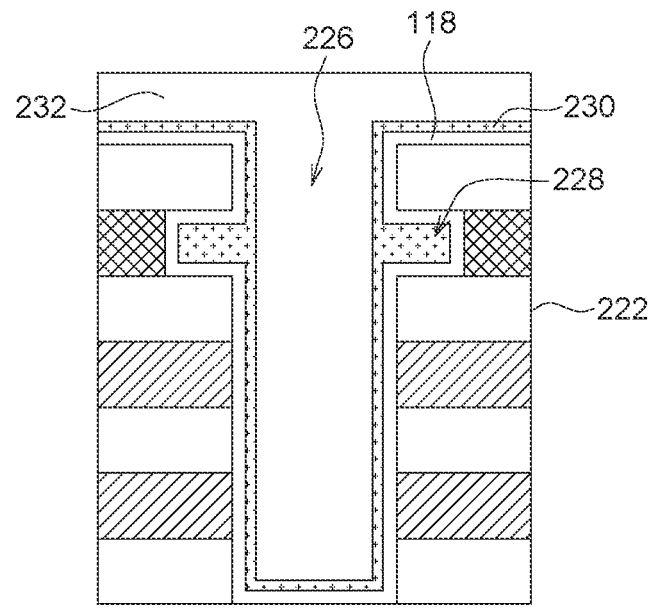

Referring to FIG. 23, the dielectric film 118 is formed in the opening 226 and the slit 228, and on an upper surface of the stacked structure 222. The dielectric film 118 may comprise an oxide such as silicon oxide. A dielectric film 230 is formed on the dielectric film 118. The dielectric film 230 may comprise a nitride such as silicon nitride. A dielectric film 232 is formed on the dielectric film 230. The dielectric film 232 may comprise an oxide such as silicon oxide.

Figure 24:
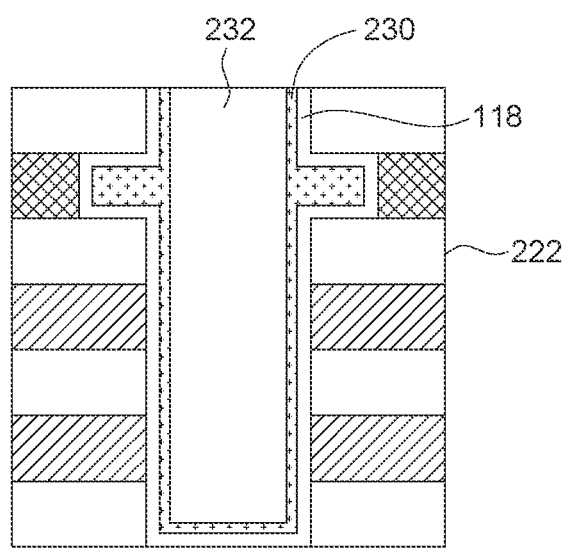

Referring to FIG. 24, a chemical mechanical polishing method is used to remove the dielectric film 118, the dielectric film 230 and the dielectric film 232 on the upper surface of the stacked structure 222.

Figure 25:
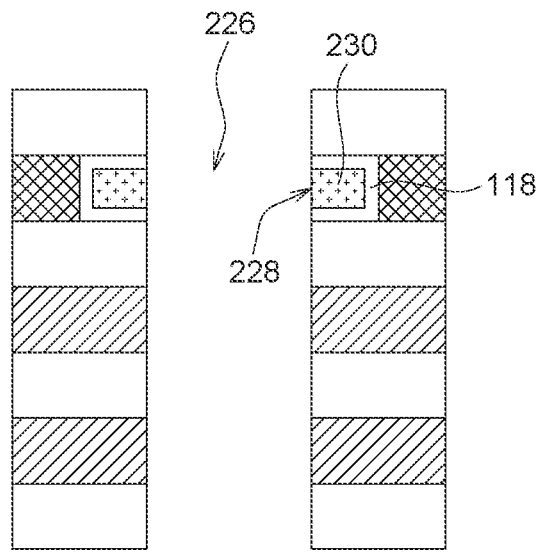

Referring to FIG. 25, an etching step is performed to remove the dielectric film 118, the dielectric film 230 and the dielectric film 232 in the opening 226, while the dielectric film 118 and the dielectric film 230 in the slit 228 are remained. A bottom of the opening 226 exposes an upper surface of the source line (not shown).

Figure 26:
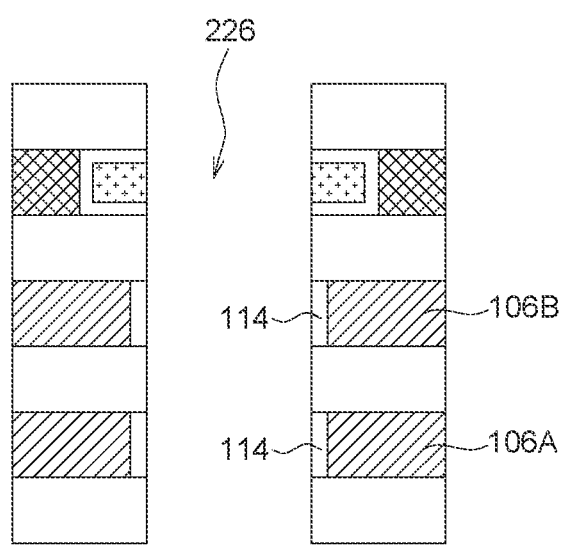

Referring to FIG. 26, the dielectric film 114 may be formed on sidewall surfaces of the gate electrode layers (the gate electrode layer 106A and the gate electrode layer 106B) exposed by the opening 226. The dielectric film 114 may comprise an oxide such as silicon oxide. In an embodiment, a material of the gate electrode layer is polysilicon, and the dielectric film 114 is formed by performing an oxidation process to the gate electrode layer.

Figure 27:
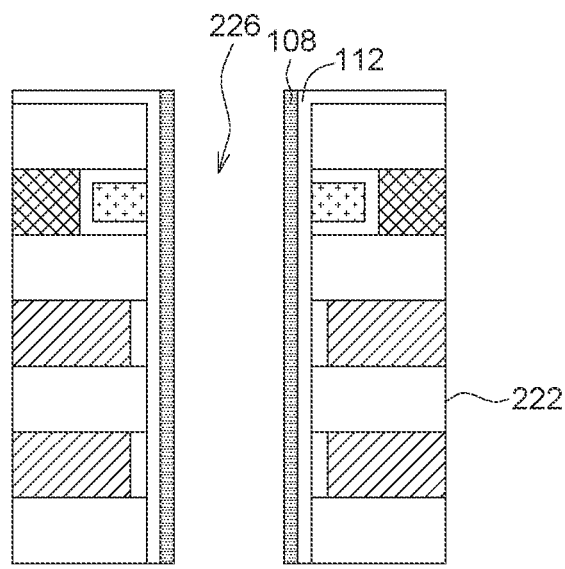

Referring to FIG. 27, a deposition method may be used to form the dielectric film 112 in the opening 226 and on the upper surface of the stacked structure 222. The dielectric film 112 may comprise a tunneling oxide. a deposition method may be used to form the channel layer 108 on the dielectric film 112 in the opening 226. A material of the channel layer 108 may comprise polysilicon or other suitable semiconductor materials.

Figure 28:
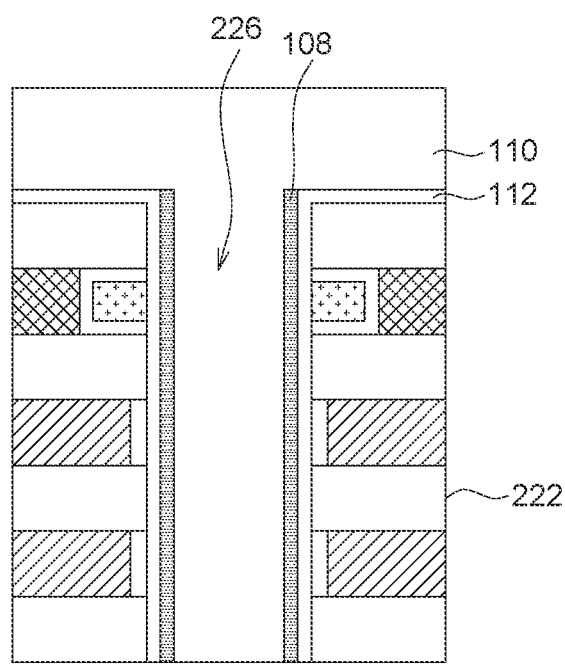

Referring to FIG. 28, the insulating element 110 is formed in the opening 226 and on the dielectric film 112 on the upper surface of the stacked structure 222. The insulating element 110 may comprise an oxide such as silicon oxide.

Figure 29:
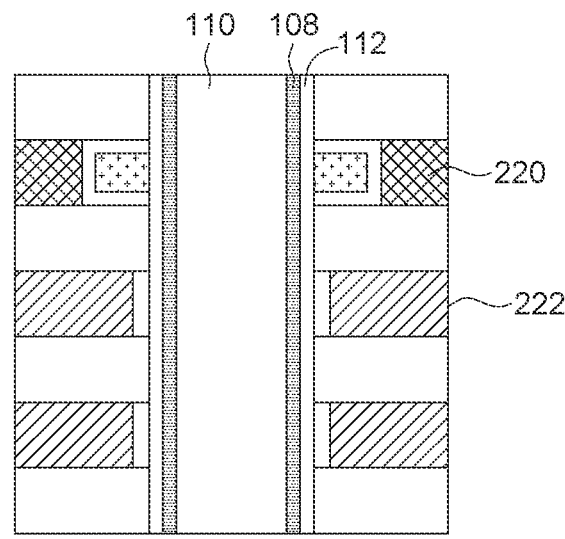

Referring to FIG. 29, a chemical mechanical polishing method is used to remove the dielectric film 112 and the insulating element 110 on the upper surface of the stacked structure 222.

Figure 30:
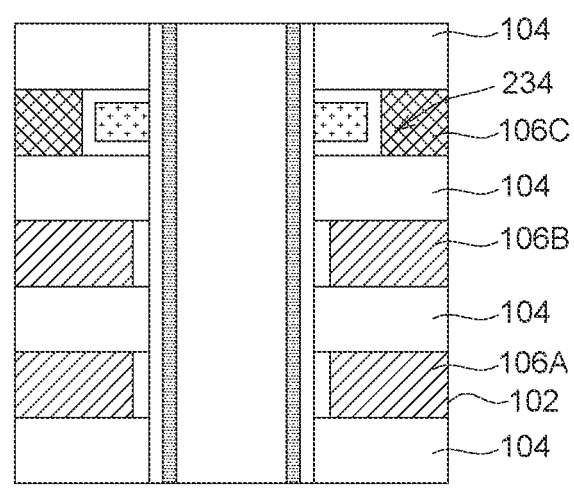

Referring to FIG. 30, an etching method is used to remove the insulating layer 220 to form the slit 234. Next, the gate electrode layer 106C is formed in the slit 234. The stacked structure 102 comprises the insulating layers 104 and the gate electrode layers (comprising the gate electrode layer 106A, the gate electrode layer 106B and the gate electrode layer 106C) stacked alternately.

The string group of the semiconductor circuit shown in FIG. 30 has a vertical split-gate structure, having a small footprint and helping increase of device density.

In the present disclosure, the string group is not limited to the vertical split-gate structure as shown in FIG. 17, FIG. 18 and FIG. 30. The string group may have other semiconductor structures.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor circuit, comprising strings, wherein the strings comprise:
   a first string comprising a first device unit and a second device unit in series, wherein the first string has a weight signal W1, the first device unit has an input signal A, the second device unit has an input signal B; and

13 a second string comprising a third device unit and a fourth device unit in series, wherein the second string has a weight signal W2, the third device unit has an input signal $\overline{A}$, the fourth device unit has an input signal $\overline{B}$; wherein, an output signal of the semiconductor circuit is a sum of output string signals of the strings, the output string signals of the strings comprise:

an output string signal of the first string being "W1*(A AND B)" or "A AND (W1*B)"; and an output string signal of the second string being "W2*( $\overline{A}$ AND $\overline{B}$ )" or "$\overline{A}$ AND (W2*$\overline{B}$ ))".

2. The semiconductor circuit according to claim 1, wherein the first string and the second string have a first node therebetween, an output signal of the first node is "(W1*(A AND B))+(W2*($\overline{A}$ AND $\overline{B}$ ))" or "(A AND (W1*B))+($\overline{A}$ AND (W2*$\overline{B}$ )".

3. The semiconductor circuit according to claim 1, wherein the first string and the second string have a first node therebetween, as the weight signal W1 is "1", and the weight signal W2 is "1", an output signal of the first node is "A XNOR B";

as the weight signal W1 is "1", and the weight signal W2 is "0", the output signal of the first node is "A AND B".

4. The semiconductor circuit according to claim 1, comprising a string group, wherein the string group comprises the first string and the second string, the first string and the second string are electrically connected in parallel.

5. The semiconductor circuit according to claim 4, further comprising a bit line and a source line, wherein the first string and the second string are electrically connected in parallel between the bit line and the source line.

6. The semiconductor circuit according to claim 1, wherein, the first string further comprises a first weight unit having the weight signal W1, the second string further comprises a second weight unit having the weight signal W2.

7. The semiconductor circuit according to claim 1, wherein, the first device unit or the second device unit have the weight signal W1, the third device unit or the fourth device unit have the weight signal W2.

8. The semiconductor circuit according to claim 1, wherein the strings are NAND strings.

9. The semiconductor circuit according to claim 1, wherein the semiconductor circuit is for performing a quantum annealing computing applying a mathematical model (M) as below, $$L_i = h_i \sigma_i + \sum_{j>i}^{n} J_{ij} \sigma_i \sigma_j \quad \text{Mathematical Model (M)}$$

wherein the first string and the second string have a first node therebetween, an output signal of the first node is "$\sigma_i$ AND $\sigma_j$" or "$\sigma_i$ XNOR $\sigma_j$", wherein the input signal A, the input signal B, the input signal $\overline{A}$ and the input signal $\overline{B}$ are gate voltages providing to the first device unit, the second device unit, the third device unit and the fourth device unit, respectively, as the gate voltages

14 are positive voltages, a variable "$\sigma_i$" or "$\sigma_j$" of the mathematical model (M) is "1", as the gate voltages are 0V, a variable "$\sigma_i$" or "$\sigma_j$" of the mathematical model (M) is "−1".

10. The semiconductor circuit according to claim 1, wherein the semiconductor circuit is for performing a quantum annealing computing applying a mathematical model (M) as below, $$L_i = h_i \sigma_i + \sum_{j>i}^{n} J_{ij} \sigma_i \sigma_j \quad \text{Mathematical Model (M)}$$

wherein the first string and the second string have a first node therebetween, an output signal of the first node is "$\sigma_i$ AND $\sigma_j$", as the first device unit and the second device unit of the first string have a low threshold voltage, and the third device unit and the fourth device unit of the second string have a high threshold voltage, a parameter "$h_i$" in the mathematical model (M) is "1", as the first device unit and the second device unit of the first string and the third device unit and the fourth device unit of the second string have the high threshold voltage, a parameter "$h_i$" in the mathematical model (M) is "0".

11. The semiconductor circuit according to claim 1, wherein the semiconductor circuit is for performing a quantum annealing computing applying a mathematical model (M) as below, $$L_i = h_i \sigma_i + \sum_{j>i}^{n} J_{ij} \sigma_i \sigma_j \quad \text{Mathematical Model (M)}$$

wherein the first string and the second string have a first node therebetween, an output signal of the first node is "$\sigma_i$ XNOR $\sigma_j$", as the first device unit and the second device unit of the first string and the third device unit and the fourth device unit of the second string have a low threshold voltage, a parameter "$J_{ij}$" in the mathematical model (M) is "1", as the first device unit and the second device unit of the first string and the third device unit and the fourth device unit of the second string have a high threshold voltage, the parameter "$J_{ij}$" in the mathematical model (M) is "0".

12. An operating method for a semiconductor circuit, comprising:

using a first string to compute a weight signal W1 input to the first string, an input signal A input to a first device unit of the first string, and an input signal B input to a second device of the first string to obtain an output string signal being "W1*(A AND B)" or "A AND (W1*B)";

using a second string to compute a weight signal W2 input to the second string, an input signal $\overline{A}$ input to a third device unit of the second string, and an input signal $\overline{B}$ input to a fourth device of second first string to obtain another output string signal being "W2* ($\overline{A}$ AND $\overline{B}$ )" or "$\overline{A}$ AND (W2*$\overline{B}$ ))"; and summing the output string signal of the first string and the another output string signal of the second string.

13. The operating method for the semiconductor circuit according to claim 12, wherein a sum of the output string signal of the first string and the another output string signal of the second string is "(W1*(A AND B))+(W2*($\overline{A}$ AND $\overline{B}$ ))" or "(A AND (W1*B))+($\overline{A}$ AND (W2*$\overline{B}$ ))".

14. The operating method for the semiconductor circuit according to claim 12, wherein as the weight signal W1 is "1", and the weight signal W2 is "1", a sum of the output string signal of the first string and the another output string signal of the second string is "A XNOR B".

15. The operating method for the semiconductor circuit according to claim 12, wherein as the weight signal W1 is "1", and the weight signal W2 is "0", a sum of the output string signal of the first string and the another output string signal of the second string is "A AND B".

16. The operating method for the semiconductor circuit according to claim 12, wherein the operating method performs a quantum annealing computing applying a mathematical model (M) as below, $$L_i = h_i\sigma_i + \sum_{j>i}^{n} J_{ij}\sigma_i\sigma_j \qquad \text{Mathematical Model (M)}$$

a sum of the output string signal of the first string and the another output string signal of the second string "$\sigma_i$ AND $\sigma_j$" or "$\sigma_i$ XNOR $\sigma_j$", the input signal A, the input signal B, the input signal $\overline{A}$ and the input signal $\overline{B}$ are gate voltages providing to the first device unit, the second device unit, the third device unit and the fourth device unit, respectively, as the gate voltages are a positive voltage, the variables "$\sigma_i$" or "$\sigma_j$" of the mathematical model (M) are "1", as the gate voltages are 0V, the variables "$\sigma_i$" or "$\sigma_j$" of the mathematical model (M) are "−1".

17. The operating method for the semiconductor circuit according to claim 12, wherein the operating method performs a quantum annealing computing applying a mathematical model (M) as below, $$L_i = h_i\sigma_i + \sum_{j>i}^{n} J_{ij}\sigma_i\sigma_j \qquad \text{Mathematical Model (M)}$$

a sum of the output string signal of the first string and the another output string signal of the second string "$\sigma_i$ AND $\sigma_j$", as the first device unit and the second device unit of the first string have a low threshold voltage, and the third device unit and the fourth device unit of the second string have a high threshold voltage, a parameter "$h_i$" in the mathematical model (M) is "1", as the first device unit and the second device unit of the first string and the third device unit and the fourth device unit of the second string have the high threshold voltage, the parameter "$h_i$" in the mathematical model (M) is "0".

18. The operating method for the semiconductor circuit according to claim 17, wherein the low threshold voltage is a negative threshold voltage, the high threshold voltage is a positive threshold voltage.

19. The operating method for the semiconductor circuit according to claim 12, wherein the operating method performs a quantum annealing computing applying a mathematical model (M) as below, $$L_i = h_i\sigma_i + \sum_{j>i}^{n} J_{ij}\sigma_i\sigma_j \qquad \text{Mathematical Model (M)}$$

a sum of the output string signal of the first string and the another output string signal of the second string "$\sigma_i$ XNOR $\sigma_j$", as the first device unit and the second device unit of the first string and the third device unit and the fourth device unit of the second string have a low threshold voltage, a parameter "$J_{ij}$" in the mathematical model (M) is "1", as the first device unit and the second device unit of the first string and the third device unit and the fourth device unit of the second string have a high threshold voltage, the parameter "$J_{ij}$" in the mathematical model (M) is "0".

20. The operating method for the semiconductor circuit according to claim 19, wherein the low threshold voltage is a negative threshold voltage, the high threshold voltage is a positive threshold voltage.

\* \* \* \* \*